(12) United States Patent  
Seo

(10) Patent No.: US 9,184,193 B2  
(45) Date of Patent: Nov. 10, 2015

(54) CAMERA MODULE AND MANUFACTURING METHOD THEREOF

(75) Inventor: Youngsoo Seo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 726 days.

(21) Appl. No.: 13/306,584

(22) Filed: Nov. 29, 2011

(65) Prior Publication Data

US 2012/0162491 A1 Jun. 28, 2012

(30) Foreign Application Priority Data

Nov. 30, 2010 (KR) .......................... 10-2010-0120825

(51) Int. Cl.
*H04N 5/225* (2006.01)
*H01L 27/146* (2006.01)

(52) U.S. Cl.
CPC ........ *H01L 27/14618* (2013.01); *H04N 5/2257* (2013.01)

(58) Field of Classification Search
CPC ..................................... H04N 5/2251–5/2257
USPC ................................. 348/373–376
See application file for complete search history.

(56) References Cited

U.S. PATENT DOCUMENTS

| | | | |
|---|---|---|---|
| 6,765,236 B2 * | 7/2004 | Sakurai | 257/98 |
| 7,012,315 B1 * | 3/2006 | Campbell | 257/433 |
| 2004/0095501 A1 * | 5/2004 | Aizawa et al. | 348/340 |
| 2006/0028573 A1 * | 2/2006 | Seo et al. | 348/340 |
| 2006/0035415 A1 * | 2/2006 | Wood et al. | 438/125 |
| 2007/0264002 A1 * | 11/2007 | Lee | 396/275 |
| 2008/0170141 A1 * | 7/2008 | Tam et al. | 348/294 |
| 2009/0128681 A1 * | 5/2009 | Kim | 348/335 |
| 2009/0278978 A1 * | 11/2009 | Suzuki | 348/345 |

FOREIGN PATENT DOCUMENTS

KR 10-0957384 B1 5/2010

* cited by examiner

*Primary Examiner* — Roberto Velez
*Assistant Examiner* — Tuan Le
(74) *Attorney, Agent, or Firm* — Birch, Stewart, Kolasch & Birch, LLP

(57) ABSTRACT

The present disclosure relates to a camera module including a PCB (Printed Circuit Board, an image sensor and a lens assembly, wherein the PCB formed with an opening, a staircase sill formed at an edge of the opening to insert a lens assembly, and an accommodation structural unit provided at a lower distal end of the opening to insert the image sensor, and wherein the image sensor is assembled to the accommodation structural unit of the PCB, and the lens assembly is inserted into the staircase sill of the PCB for assembly.

7 Claims, 4 Drawing Sheets

CAMERA MODULE AND MANUFACTURING METHOD THEREOF

Pursuant to 35 U.S.C. §119 (a), this application claims the benefit of earlier filing date and right of priority to Korean Patent Application No. 10-2010-0120825, filed on Nov. 30, 2010, the contents of which is hereby incorporated by reference in their entirety.

BACKGROUND OF THE DISCLOSURE

1. Field

The teachings in accordance with the exemplary embodiments of this present disclosure generally relate to a camera module and a manufacturing method thereof.

2. Background

Recently, demands on a small-sized compact camera module are on the increase for use in various multimedia fields including notebook type personal computers, camera phones, PDAs (Personal Digital Assistants), smart phones and toys, and in image input equipment including monitoring cameras and information terminals for video tape recorders. Particularly, designs have become such elements that have a great influence on sales of mobile phones, whereby small-sized camera modules are greatly on demand.

The camera module is generally manufactured using an image sensor chip or a photoelectric conversion device of a CCD (Charge Coupled Device) type or a CMOS (Complementary Metal Oxide Semiconductor) type to converge light from an object to a photosensitive element and to form an image of the object on a display medium such as a display device.

FIG. 1 is a cross-sectional view illustrating a camera module according to prior art, from which the camera module according to prior art will be briefly described.

Referring to FIG. 1, a PCB (Printed Circuit Board, 10) is mounted with an image sensor (20), and a lens assembly (30) mounted with a plurality of lenses on a light irradiation path is positioned at an upper surface of the image sensor (20). Furthermore, a housing (40) is also mounted for supporting and guiding a position of the lens assembly (30).

The lens assembly (30) in the conventional camera module is bonded to an upper periphery of the PCB (10) by an adhesive to allow light to be irradiated from the plurality of lenses to the image sensor (20). On the drawing, an adhesive (50)) is coated to a bottom surface of the lens assembly (30) or an upper surface of the PCB (10) to adhesively fix the lens assembly (30), where there occurs the following problems in a case the adhesive (50) of conventional epoxy is coated to the bottom surface of the lens assembly (30) or the upper surface of the PCB (10). However, the conventional method using the epoxy generates the following problems.

That is, a relatively evenly coated thickness must be applied, but if even thickness is not coated, a vertical tilting is generated from the bonded lens assembly (30) to have an influence on a resolution, whereby the adjacent image sensor (20) on the PCB (10) is applied with a physical influence during curing of the coated epoxy to ill affect the resolution of the image sensor (20).

Another problem is that a direct contact between the lens assembly (30) and the PCB (10) may cause a physical damage to the lens assembly (30). Still further problem is that a coated surface is too narrow to weaken an adhesive strength and a product may develop a failure if epoxy is introduced into the image sensor side.

SUMMARY

The present disclosure has been made to solve the foregoing problems of the prior art and therefore an object of certain embodiments of the present disclosure is to provide a camera module configured to prevent an image sensor from damage, and to facilitate an optical alignment.

Technical subjects to be solved by the present disclosure are not restricted to the above-mentioned description, and any other technical problems not mentioned so far will be clearly appreciated from the following description by the skilled in the art. That is, the present disclosure will be understood more easily and other objects, characteristics, details and advantages thereof will become more apparent in the course of the following explanatory description, which is given, without intending to imply any limitation of the disclosure, with reference to the attached drawings.

An object of the invention is to solve at least one or more of the above problems and/or disadvantages in whole or in part and to provide at least advantages described hereinafter. In order to achieve at least the above objects, in whole or in part, and in accordance with the purposes of the invention, as embodied and broadly described, and in one general aspect of the present invention, there is provided a camera module, the camera module comprising: an image sensor; a PCB (Printed Circuit Board) including an opening, a staircase sill formed at an edge of the opening to insert a lens assembly, and an accommodation structural unit provided at a lower distal end of the opening to insert the image sensor; and a lens assembly inserted into the staircase sill of the PCB.

Preferably, the camera module further comprises a housing, a case formed with a hole at an upper center and having a bottom-opened inner space, that accommodates the lens assembly and that is secured at a bottom distal end with an upper surface of the PCB.

Preferably, an adhesive is coated on a horizontal surface unit of the staircase sill and a bottom distal surface of the lens assembly for mutual attachment therebetween.

Preferably, an adhesive is coated on a vertical surface unit of the staircase sill and a bottom external wall surface of the lens assembly for mutual attachment therebetween.

Preferably, the adhesive is an epoxy.

Preferably, the image sensor is assembled with the accommodation structural unit of the PCB and attached by stud bump bonding.

Preferably, the PCB is an LTCC (Low Temperature Co-fired Ceramic) PCB or an HTCC (High Temperature Co-fired Ceramic) PCB.

In another general broad aspect of the present invention, there is provided a method for manufacturing a camera module, the method comprising: preparing a PCB formed with an opening, a staircase sill formed at an edge of the opening, and an accommodation structural unit provided at a lower distal end of the opening; assembling an image sensor to the accommodation structural unit of the PCB; coating an adhesive to the staircase sill of the PCB; inserting a lens assembly into the staircase sill coated with the adhesive of the PCB and mutually attaching the lens assembly with the stair case sill; and preparing a housing formed with a hole at an upper center and having a bottom-opened inner space, aligning an optical axis of the lens assembly to the center hole and securing a bottom distal end thereof to an upper surface of the PCB.

Preferably, the staircase sill is formed with a horizontal surface unit and a vertical surface unit, and the horizontal surface unit is coated with the adhesive in the step of coating the adhesive.

Preferably, the staircase sill is formed with a horizontal surface unit and a vertical surface unit, and the vertical surface unit is coated with the adhesive in the step of coating the adhesive.

Preferably, the adhesive is an epoxy.

The camera module according to the present disclosure has an advantageous effect in that a lens assembly and an image sensor are not directly brought into contact to prevent the image sensor from being damaged by contact, and a staircase sill is made to exist to easily align an optical axis.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, these exemplary embodiments are provided so that this description will be thorough and complete, and will fully convey the scope of the present inventive concept to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Descriptions of well-known components and processing techniques are omitted so as to not unnecessarily obscure the embodiments of the disclosure.

Hereinafter, a camera module and a manufacturing method thereof will be described in detail with reference to the accompanying drawings.

Figure 1:
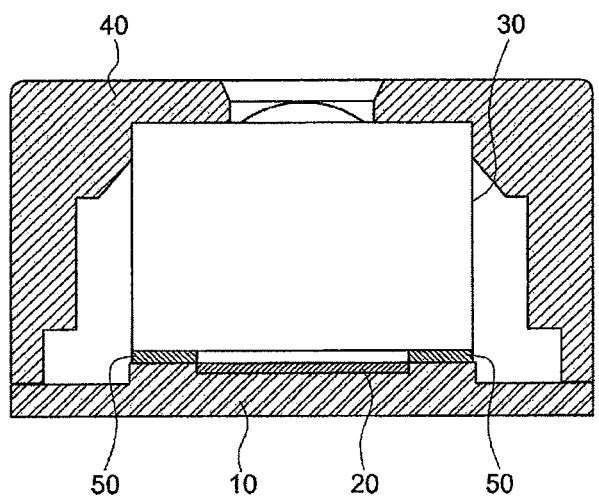
FIG. 1 is a cross-sectional view illustrating a camera module according to prior art.
Figure 2:
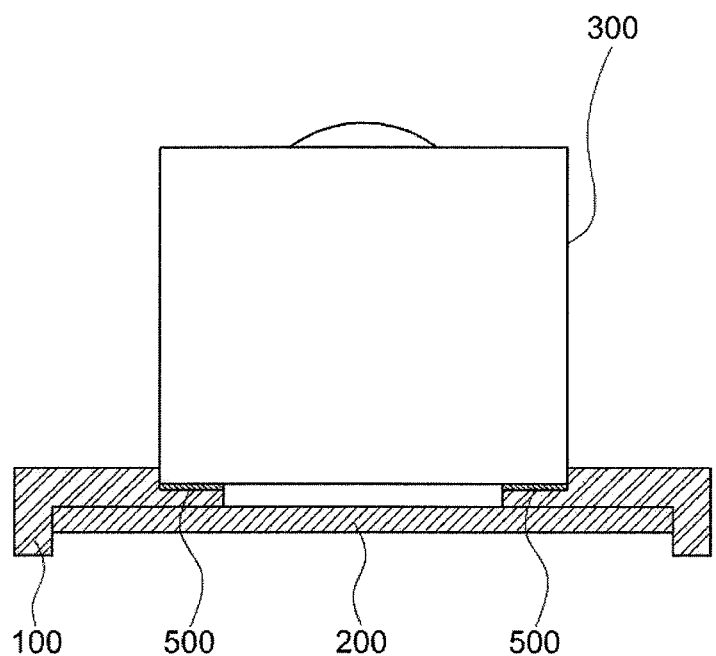
FIG. 2 is a cross-sectional view illustrating a camera module according to an exemplary embodiment of the present invention.
Figure 3:
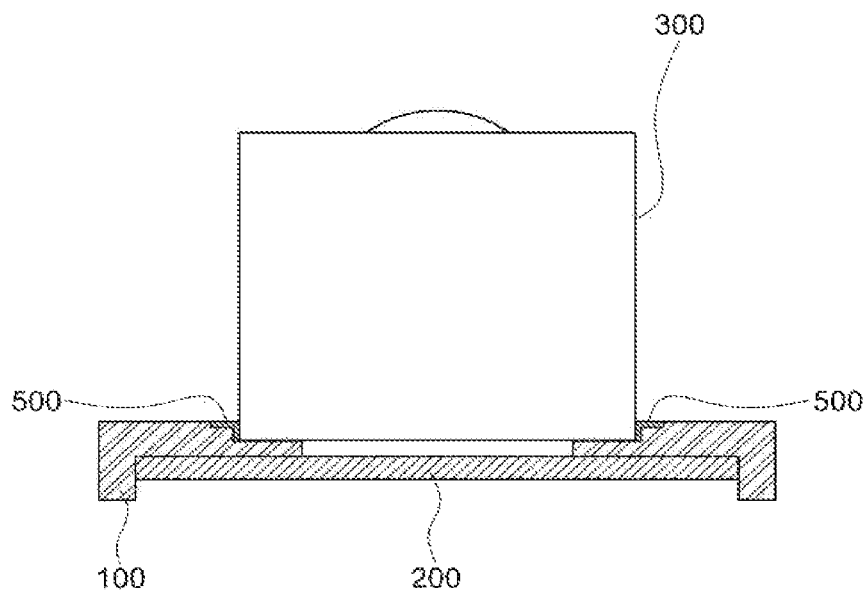
FIG. 3 is a cross-sectional view illustrating a camera module according to another exemplary embodiment of the present invention.
Figure 4:
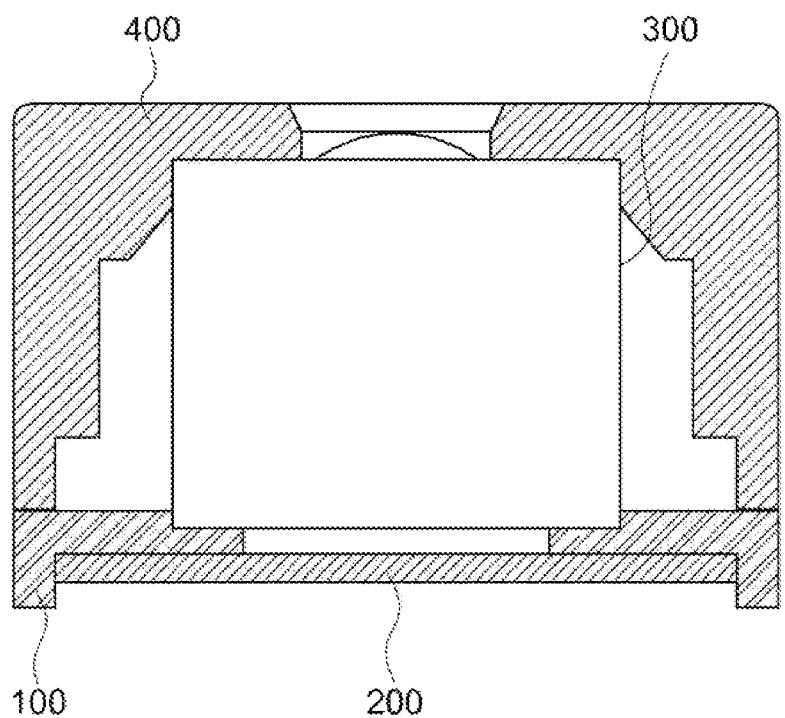
FIG. 4 is a cross-sectional view illustrating a camera module according to still another exemplary embodiment of the present invention.

FIG. 2 is a cross-sectional view illustrating a camera module according to an exemplary embodiment of the present invention, FIG. 3 is a cross-sectional view illustrating a camera module according to another exemplary embodiment of the present invention, and FIG. 4 is a cross-sectional view illustrating a camera module according to still another exemplary embodiment of the present invention.

Referring to FIGS. 2 and 3, a camera module according to an exemplary embodiment of the present disclosure may include a PCB (Printed Circuit Board) 100, an image sensor 200, and a lens assembly 300, and further include a housing 400 as shown in FIG. 4.

The PCB 100 is formed with an opening, a staircase sill formed at an edge of the opening to allow the lens assembly 300 to be inserted into a precise position, and an accommodation structural unit provided at a lower distal end of the opening to insert the image sensor. The staircase sill is formed with a horizontal surface unit and a vertical surface unit. The PCB may be an LTCC (Low Temperature Co-fired Ceramic) PCB or an HTCC (High Temperature Co-fired Ceramic) PCB, but it is not limited thereto.

The image sensor 200 is formed with a CCD (Charge Coupled Device) that changes light incident through a lens formed on the lens assembly 300 positioned at an upper surface of the image sensor 200 at a predetermined gap to an electrical signal, and is assembled at and interconnected by stud bump bonding method to the accommodation structural unit at a bottom distal end of the PCB 100. However, the attachment method is not limited thereto and FC (Flip-Chip) method may be also applied.

An adhesive is coated on a horizontal surface unit of the staircase sill formed at an upper surface of an edge of the opening at the PCB 100 and a bottom distal surface of the lens assembly 300 for interconnection therebetween. At this time, the lens assembly 300 is guided by the staircase sill to minimize a shifted amount of the lens assembly 300.

Furthermore, an adhesive is coated on a vertical surface unit of the staircase sill formed at an upper surface of an edge of the opening at the PCB 100 and a bottom external wall surface of the lens assembly 300 for mutual attachment therebetween. At this time, a shifted amount of the lens assembly 300 can be minimized, and a small image height margin that causes a problem to the lens assembly 300 can be controlled by mechanical guide.

As noted above, although it is possible to select the horizontal surface unit or the vertical surface unit of the staircase sill, and to coat the adhesive to any one surface unit of the staircase sill for interconnection between the PCB 100 and the lens assembly 300, it is also possible to coat both the horizontal surface unit and the vertical surface unit of the staircase sill for interconnection between the PCB 100 and the lens assembly 300. The adhesive may be epoxy, but the adhesive is not limited to the epoxy.

The lens assembly 300 is coupled to the staircase sill formed at the upper surface of the edge of the opening at the PCB 100, and the image sensor 200 is assembled to the accommodation structural unit at the bottom distal end of the PCB 100 to allow the lens assembly 300 to face the image sensor 200 across the opening of the PCB 100. However, the bottom surface of the lens assembly 300 and the upper surface of the image sensor 200 are not directly brought into contact by the staircase sill of the PCB 100 and the structure of the accommodation structural unit and instead maintain a predetermined gap therebetween, whereby damage to the image sensor 200 caused by contact between the bottom surface of the lens assembly 300 and the image sensor 200 can be prevented.

Referring to FIG. 4, the housing 400, which is a case formed with a hole at an upper center and having a bottom-opened inner space, accommodates the lens assembly 300 therein and is secured at a bottom distal end with an upper surface of the PCB 100.

Figure 5:
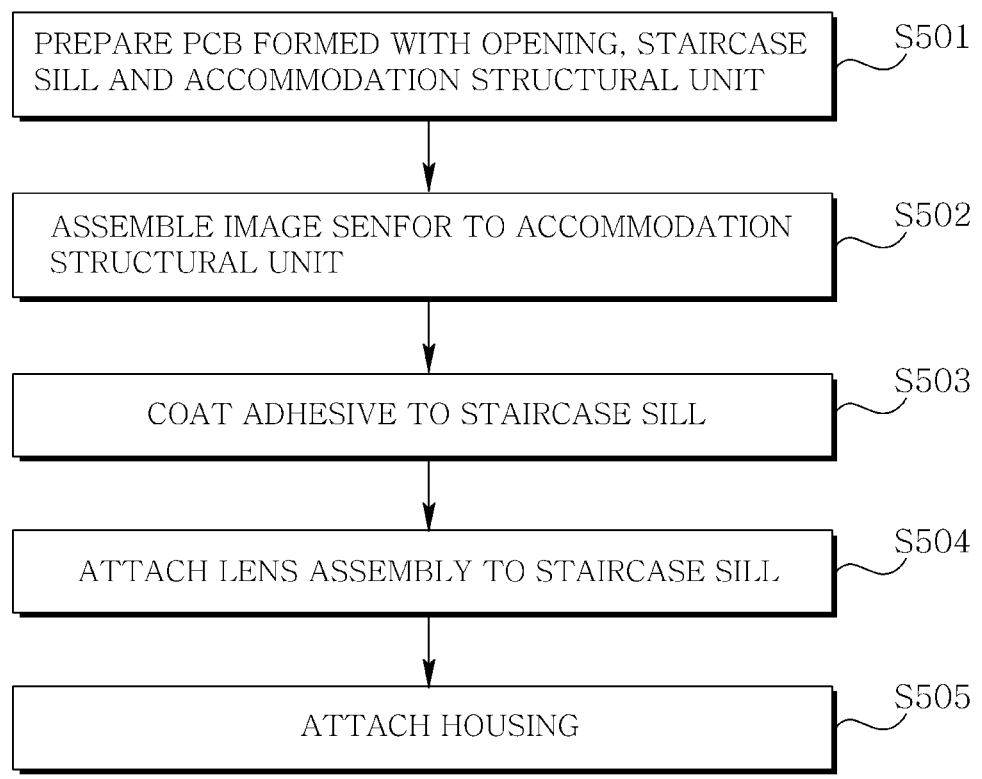
FIG. 5 is a flowchart illustrating a manufacturing method of a camera module according to exemplary embodiment of the present invention.

FIG. 5 is a flowchart illustrating a manufacturing method of a camera module according to an exemplary embodiment of the present invention.

Referring to FIG. 5, first, preparation is made for a PCB 100 formed with an opening, a staircase sill formed at an edge of the opening, and an accommodation structural unit provided at a lower distal end of the opening S501. Then, an image sensor 200 is assembled to the accommodation structural unit of the PCB 100 that the step of S502.

Successively, an adhesive is coated to the staircase sill of the PCB S503. And now, a lens assembly 300 is inserted into the staircase sill coated with the adhesive of the PCB 100 for mutual attachment of the lens assembly 300 with the staircase sill that the step of S504.

Next, preparation is made for a housing formed with a hole at an upper center and having a bottom-opened inner space to align an optical axis of the lens assembly 300 to the center hole and to secure a bottom distal end thereof to an upper surface of the PCB 100 the step of S505. At this time, it should be apparent that the steps of S503 and S504 may be reversed.

At this time, the staircase sill is formed with a horizontal surface unit and a vertical surface unit, and adhesive is coated to the horizontal surface unit or the vertical surface unit at the step of S502, where epoxy may be used as adhesive is epoxy but the adhesive is not limited thereto.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

The camera module and the manufacturing method thereof according to the present invention has an industrial applicability in that a lens assembly and an image sensor are not directly brought into contact to prevent the image sensor from being damaged by contact, and a staircase sill is made to exist to easily align an optical axis.

What is claimed is:

1. A camera module, the camera module comprising:
an image sensor;
a lens assembly;
a PCB (Printed Circuit Board) including an opening, a staircase sill provided at an upper surface to dispose the lens assembly, and an accommodation structural unit provided at a bottom surface to dispose the image sensor; and
a housing comprising a bottom-opened inner space and a hole at an upper surface, the housing secured at a bottom distal end with an upper surface of the PCB,
wherein the lens assembly is disposed within the inner space, and
wherein the lens assembly is fixed at the staircase sill via contact between an upper surface of the lens assembly and a bottom side of the upper surface of the housing.

2. The camera module of claim 1, wherein an adhesive is coated on a horizontal surface unit of the staircase sill and a bottom distal surface of the lens assembly for mutual attachment therebetween.

3. The camera module of claim 2, wherein the adhesive is an epoxy.

4. The camera module of claim 1, wherein an adhesive is coated on a vertical surface unit of the staircase sill and a bottom external wall surface of the lens assembly for mutual attachment therebetween.

5. The camera module of claim 4, wherein the adhesive is an epoxy.

6. The camera module of claim 1, wherein the image sensor is assembled with the accommodation structural unit of the PCB and attached by stud bump bonding.

7. The camera module of claim 1, wherein the PCB is a low-temperature co-fired ceramic PCB or a high-temperature co-fired ceramic PCB.

* * * * *